United States Patent
Liu

(10) Patent No.: US 10,367,073 B2
(45) Date of Patent: Jul. 30, 2019

(54) THIN FILM TRANSISTOR (TFT) WITH STRUCTURED GATE INSULATOR

(71) Applicant: BOE TECHNOLOGY GROUP CO., LTD., Beijing (CN)

(72) Inventor: Chien Hung Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/820,594

(22) Filed: Nov. 22, 2017

(65) Prior Publication Data

US 2018/0301565 A1   Oct. 18, 2018

(30) Foreign Application Priority Data

Apr. 12, 2017   (CN) .......................... 2017 1 0236997

(51) Int. Cl.
| | |
|---|---|
| H01L 29/423 | (2006.01) |
| H01L 29/786 | (2006.01) |
| H01L 21/265 | (2006.01) |
| H01L 29/49 | (2006.01) |
| H01L 21/28 | (2006.01) |
| H01L 29/66 | (2006.01) |
| H01L 21/266 | (2006.01) |

(52) U.S. Cl.
CPC ...... *H01L 29/42384* (2013.01); *H01L 21/266* (2013.01); *H01L 21/26513* (2013.01); *H01L 21/28158* (2013.01); *H01L 29/4908* (2013.01); *H01L 29/66492* (2013.01); *H01L 29/66757* (2013.01); *H01L 29/78627* (2013.01); *H01L 29/78696* (2013.01); *H01L 29/66969* (2013.01); *H01L 2029/42388* (2013.01)

(58) Field of Classification Search
CPC ......... H01L 29/42364; H01L 29/42368; H01L 29/42384; H01L 2029/42388; H01L 29/66757

See application file for complete search history.

(56) References Cited

U.S. PATENT DOCUMENTS

| 2013/0337618 A1 | 12/2013 | Han et al. | |
| 2017/0155002 A1* | 6/2017 | Zhou | ..................... H01L 29/06 |
| 2017/0179164 A1* | 6/2017 | Choi | ................. G02F 1/133345 |

(Continued)

FOREIGN PATENT DOCUMENTS

| CN | 104538403 A | 4/2015 |
| CN | 104916584 A | 9/2015 |
| CN | 106328715 A | 1/2017 |

OTHER PUBLICATIONS

Chinese Office Action in Chinese Application No. 201710236997.4, dated May 5, 2019 with English translation.

*Primary Examiner* — Scott B Geyer
(74) *Attorney, Agent, or Firm* — Collard & Roe, P.C.

(57) ABSTRACT

A thin-film transistor (TFT) and a manufacturing method thereof, an array substrate and a display device are provided. The TFT includes: a base substrate; a gate electrode and a gate insulating layer, disposed on the base substrate; and an active layer, wherein the gate insulating layer is disposed between the active layer and the gate electrode; the active layer includes a channel region and a doped region disposed on at least one side of the channel region; and the gate insulating layer is provided with a protrusion which is disposed between the doped region and the gate electrode.

8 Claims, 8 Drawing Sheets

(56) References Cited

U.S. PATENT DOCUMENTS

2017/0184892 A1  6/2017 Liu
2017/0373091 A1* 12/2017 Lim .................... H01L 27/1225
2018/0108746 A1*  4/2018 Zhao ................. H01L 21/26513
2018/0114866 A1*  4/2018 Lee ................... H01L 29/78675

* cited by examiner

THIN FILM TRANSISTOR (TFT) WITH STRUCTURED GATE INSULATOR

CROSS REFERENCE TO RELATED APPLICATIONS

Application claims priority under 35 U.S.C. § 119 of Chinese Application No. 201710236997.4 filed on Apr. 12, 2017, the disclosure of which is incorporated by reference.

TECHNICAL FIELD

Embodiments of the present disclosure relate to a thin-film transistor (TFT), a manufacturing method thereof, an array substrate and a display device.

BACKGROUND

With the growth in the living standard, the current users have higher and higher requirement on display products, especially in an aspect of improving the display image quality. However, due to the structural limitation of the conventional TFT, the problem of image flickering of the display products in which a TFT is used as a switching element of a subpixel cannot be eliminated or alleviated. Therefore, how to effectively alleviate a defect of image flickering and the like of the display products has become a problem for the current manufacturers.

SUMMARY

At least one embodiment of the present disclosure provides a thin-film transistor (TFT) and a manufacturing method thereof, an array substrate and a display device, which can reduce and even eliminate the parasitic capacitance produced between the gate electrode and the active layer, and can improve the electrical performance of the thin-film transistor (TFT).

At least one embodiment of the present disclosure provides a thin-film transistor (TFT), comprises: a base substrate; a gate electrode and a gate insulating layer, disposed on the base substrate; and an active layer, wherein the gate insulating layer is disposed between the active layer and the gate electrode; the active layer includes a channel region and a doped region disposed on at least one side of the channel region; and the gate insulating layer is provided with a protrusion which is disposed between the doped region and the gate electrode.

At least one embodiment of the present disclosure provides an array substrate comprising the TFT as mentioned above.

At least one embodiment of the present disclosure provides a display device comprising the array substrate as mentioned above.

At least one embodiment of the present disclosure provides a method for manufacturing a TFT, and the method comprises: providing a base substrate; forming an active layer, a gate insulating layer and a gate electrode on the base substrate in sequence; and forming a channel region and a doped region disposed on at least one side of the channel region in the active layer, wherein the gate insulating layer is provided with a protrusion disposed between the doped region and the gate electrode.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1b is a schematic partial view of the TFT as shown in FIG. 1a;

FIG. 2b is a schematic partial view of the TFT as shown in FIG. 2a;

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise specified, the technical terms or scientific terms used in the present disclosure have normal meanings understood by those skilled in the art. The words "first", "second" and the like used in the present disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

In a TFT, a polysilicon (poly-Si) active layer (including a low temperature polysilicon (LTPS) or high temperature polysilicon (HTPS) active layer) has higher carrier mobility than an amorphous silicon (a-Si) active layer, so poly-Si TFTs are more and more widely applied. However, the relatively high carrier mobility of poly-Si tends to produce hot carrier effect and the like, resulting in problems of threshold voltage drifting and the like of the TFT including the poly-Si active layer. In order to avoid the hot carrier effect in the poly-Si active layer, doped regions with different doping concentrations are generally formed in a second doped region and a channel region of the poly-Si active layer. In addition, in the current TFT, a flat interface may be usually disposed between a gate electrode metal and a gate insulating layer. In this structure, parasitic capacitance will be produced between the doped region, particularly a heavily doped region, of the active layer and the gate electrode. Moreover, due to the problems of limited process accuracy in actual production and the like, a length of a lightly doped region in the active layer cannot be accurately controlled, finally resulting in poor electrical performance and electrical uniformity of the TFT.

Figure 1A:
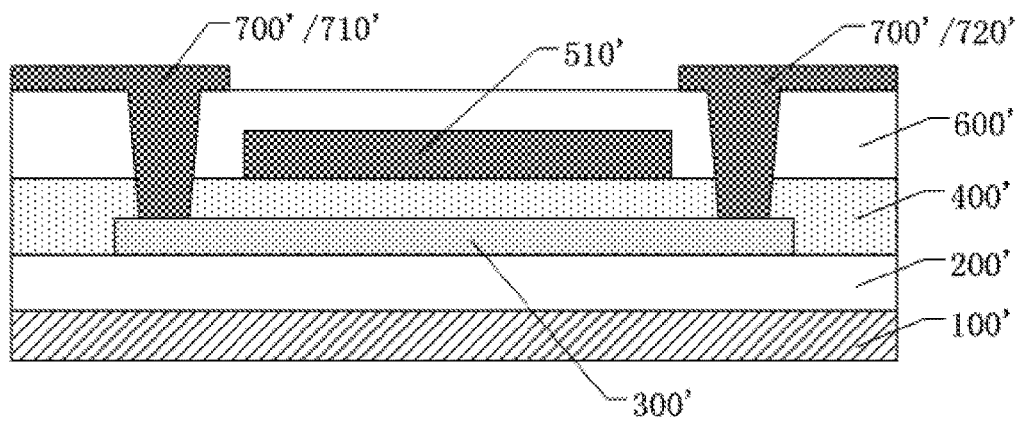
FIG. 1a is cross-sectional view of a TFT.
Figure 1B:
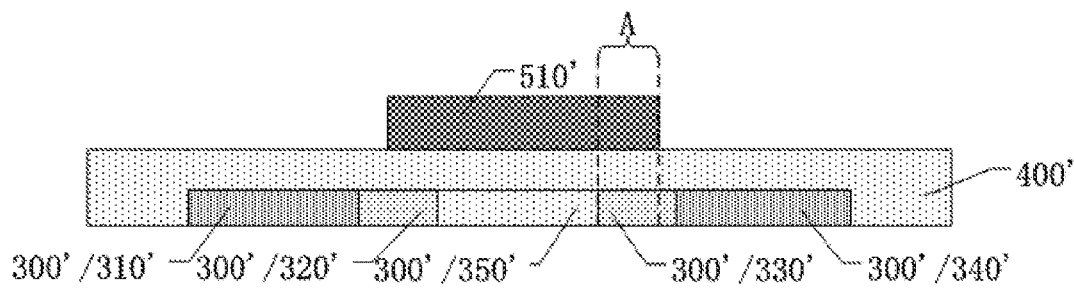

FIG. 1a is a cross-sectional view of a TFT, and FIG. 1b is a schematic partial view of the TFT as shown in FIG. 1a. As illustrated in FIGS. 1a and 1b, the TFT may comprise: a base substrate 100', and a buffer layer 200', an active layer 300', a gate insulating layer 400', a gate electrode 510', an interlayer medium layer 600' and a source-drain electrode layer 700' disposed on the base substrate 100' in sequence. The active layer 300' includes a doped region and a channel region 350'. The doped region may include a first doped region and a second doped region. A heavily doped region, for instance, may include a first heavily doped region 310' and a second heavily doped region 340' and is not adjacent to the channel region 350'. A lightly doped region, for instance, may include a first lightly doped region 320' and a second lightly doped region 330' and is adjacent to the channel region 350'.

The gate electrode 510' may made the active layer 300' to be switched on when applied with a switching-on signal, so as to realize the electrical connection between a source electrode 710' and a drain electrode 720' of the source-drain electrode layer 700'. But relatively large parasitic capacitance may be produced due to partial overlapping of the gate electrode 510' and the doped region of the active layer 300'. For instance, at an overlapping region A of the gate electrode 510' and the second doped region, as the gate electrode 510' is close to the second doped region, the parasitic capacitance produced between both is relatively large, and hence the electrical performances of the TFT can be affected. In addition, in a manufacturing process of the current TFT, the gate electrode 510' is formed after a step of forming the doped region in the active layer 300', so the position and the length of the doped region, for instance, the first lightly doped region 320', in the active layer 300' cannot be accurately controlled. Thus, the alignment accuracy between the gate electrode 510' and the lightly doped region is not high, and hence the electrical uniformity of the TFT is adversely affected.

Figure 1C:
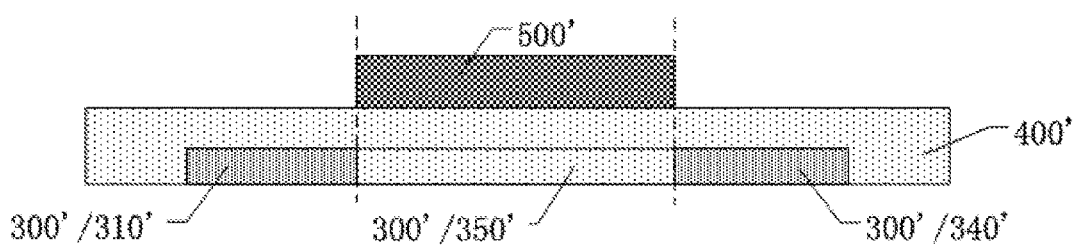
FIGS. 1c-1f are flow diagrams illustrating a manufacturing processes of the TFT as shown in FIG. 1b.
Figure 1D:
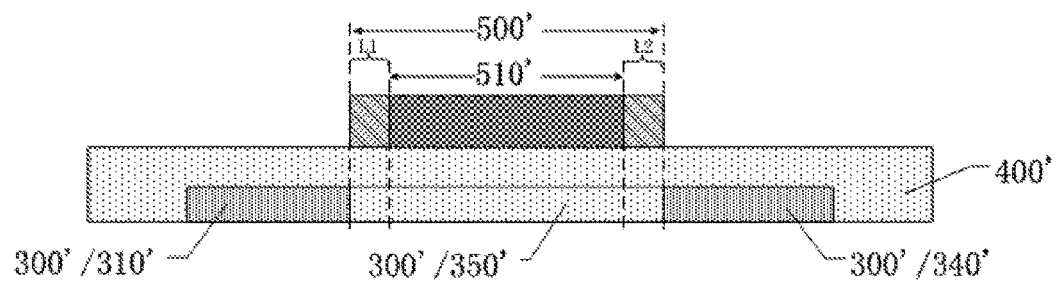
Figure 1E:
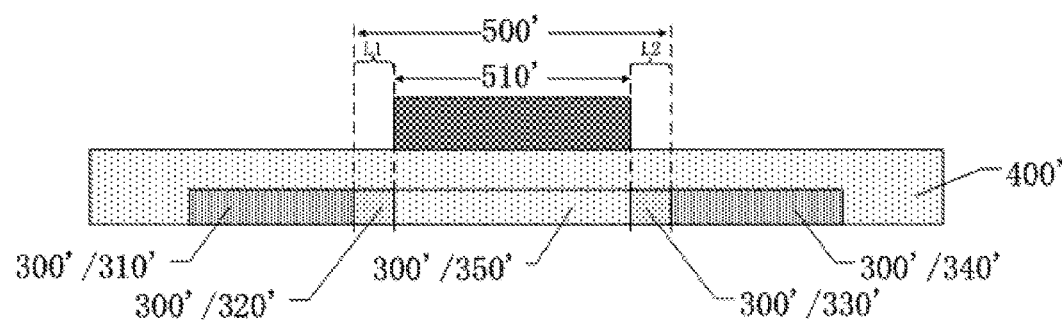
Figure 1F:
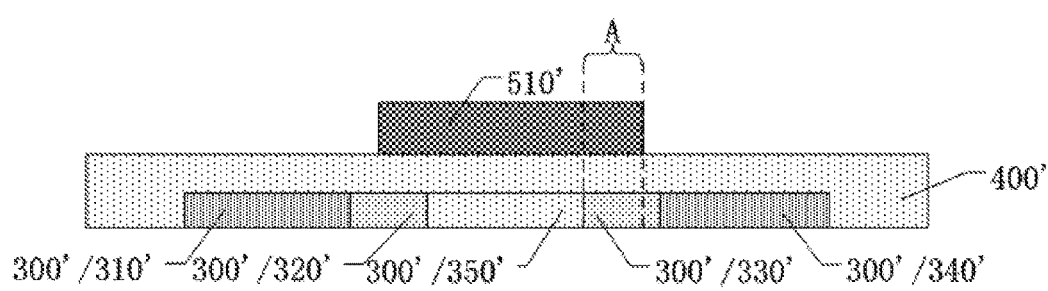

FIGS. 1c-1f are flow diagrams illustrating a manufacturing process of the TFT as shown in FIG. 1b, and are flow diagrams illustrating the manufacturing processes of partial structures of the TFT. As illustrated in FIGS. 1c-1f, the manufacturing process of the TFT may comprise: as shown in FIG. 1c, after forming the active layer 300', the gate insulating layer 400' and the gate electrode 500' on the base substrate 100' in sequence, forming the first heavily doped region 310' and the second heavily doped region 340' in the active layer 300' by adoption of the gate electrode 500' as a mask by using a doping process, for instance, ion implantation; as shown in FIG. 1d, patterning the gate electrode 500', removing L1 and L2 portions of the gate electrode 500', and obtaining a gate electrode 510'; as shown in FIG. 1e, forming the first lightly doped region 320' and the second lightly doped region 330' in the active layer 300' by adoption of the gate electrode 510' as a mask by using a doping process, e.g., ion implantation, and at this point, the removed L1 and L2 portions of the gate electrode 500' may limit forming positions of the first lightly doped region 320' and the second lightly doped region 330', namely self-alignment can be realized in a forming process of the lightly doped region; and as shown in FIG. 1f, performing an activation treatment, e.g., annealing process, on the active layer 300', and the doped region in the active layer 300' will be extended, so the doped region will be partially overlapped with the gate electrode 510'. Although the above manufacturing method of the TFT can realize self-alignment in the forming process of the lightly doped region, the process is complex. Moreover, in actual process, due to factors such as equipment accuracy and process change, the alignment accuracy between the gate electrode 510' and the lightly doped region is not high.

At least one embodiment of the present disclosure provides a TFT, a manufacturing method thereof, an array substrate and a display device to solve the above technical problems. The TFT comprises: a base substrate, and a gate electrode and a gate insulating layer disposed on the base substrate; and an active layer, the gate insulating layer being disposed between the active layer and the gate electrode; the active layer includes a channel region and a doped region disposed on at least one side of the channel region; and the gate insulating layer is provided with a protrusion which is disposed between the doped region and the gate electrode. The protrusion can increase a spacing distance between the doped region in the active layer and the gate electrode, reduce the parasitic capacitance produced by overlapping of the doped region and the gate electrode, and improve the electrical performances of the TFT.

It should be noted that the number of the doped region in the active layer may be one and may also be two or more than two, and the number of the protrusion may also be one or more than one. The parasitic capacitance produced by partial overlapping of the doped region and the gate electrode can be reduced as long as the protrusion is disposed between the doped region and the gate electrode. The active layer may be usually provided with two doped regions. For convenient understanding of the technical proposals in the embodiments of the present disclosure, description is given to the technical proposals in the embodiments of the present disclosure in all the following embodiments by taking the case that the active layer is provided with two doped regions and the protrusions are also correspondingly set to be two (for instance, a first protrusion and a second protrusion) as an example.

In the following embodiments of the present disclosure, in a direction perpendicular to the base substrate, overlapping of the protrusion and the active layer may include: in the direction perpendicular to the base substrate, an orthographic projection of the protrusion on the base substrate is located within an orthographic projection of the active layer on the base substrate; or, the orthographic projection of the protrusion on the base substrate is partially overlapped with the orthographic projection of the active layer on the base substrate; or the orthographic projection of the protrusion on the base substrate is completely overlapped with an orthographic projection of a portion of the active layer on the base substrate, as long as the protrusion may separate a portion of the gate electrode and a portion of the active layer at the position of the protrusion.

As described above, if the gate electrode is overlapped with a portion of a region of the active layer, e.g., the doped region, the parasitic capacitance will be produced. In the TFT provided by at least one embodiment of the present disclosure, the first protrusion and the second protrusion disposed on the gate insulating layer can increase the spacing distance between the doped region in the active layer and the gate electrode, reduce the parasitic capacitance produced by overlapping of the doped region and the gate electrode, and hence improve the electrical performances of the TFT. Moreover, in the TFT provided by at least one embodiment of the present disclosure, the first protrusion and the second protrusion are partially overlapped with the gate electrode, and portions of the first protrusion and the second protrusion not overlapped with the gate electrode may also be used for self-alignment in the forming process of the doped region, e.g., the lightly doped region. Thus, the process is simple, and the electrical uniformity of the TFT can be further improved.

For convenient understanding of the technical solution of the present disclosure, description will be given below to the technical solution of the present disclosure with reference to several embodiments.

A First Embodiment

Figure 2A:
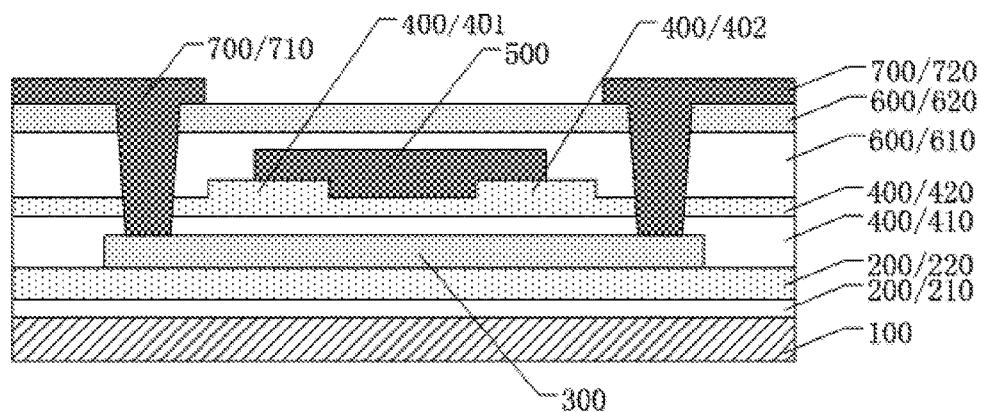
FIG. 2a is a cross-sectional view of a TFT provided by an embodiment of the present disclosure.

At least one embodiment of the present disclosure provides a TFT. FIG. 2a is a cross-sectional view of the TFT provided by an embodiment of the present disclosure, and FIG. 2b is a partial cross-sectional view of the TFT as shown in FIG. 2a.

At least one embodiment of the present disclosure provides a TFT. For instance, as illustrated in FIGS. 2a and 2b, the TFT may comprise: a base substrate 100, and an active layer 300, a gate insulating layer 400 and a gate electrode 500 disposed on the base substrate 100 in sequence, wherein the active layer 300 includes a channel region 350 and a doped region (not shown in the figure, which may refer to a position where a first doped region 301 and a second doped region 302 are located as described below) disposed on at least one side of the channel region 350; the gate insulating layer 400 is provided with a protrusion (not shown in the figure, which may refer to a position where a first protrusion 401 or a second protrusion 402 is located as described below); and the protrusion is disposed between the doped region and the gate electrode 500. The protrusion can increase the spacing distance between the doped region in the active layer and the gate electrode 500, reduce the parasitic capacitance produced by overlapping of the doped region and the gate electrode 500, and improve the electrical performance of the TFT.

For instance, in the TFT provided by the embodiment of the present disclosure, the active layer 300 may be made from a material such as a poly-Si and an oxide semiconductor. The poly-Si may be HTPS or LTPS. The oxide semiconductor may be indium gallium zinc oxide (IGZO), zinc oxide (ZnO), etc.

Figure 2B:
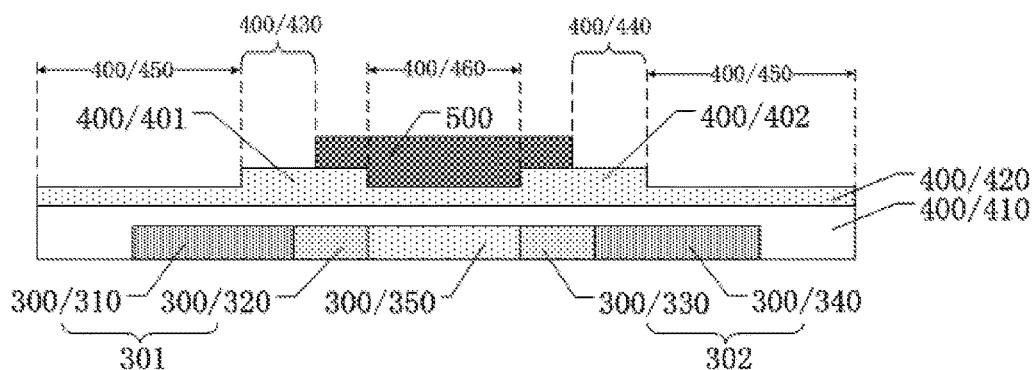

For instance, in at least one embodiment of the present disclosure, as shown in FIGS. 2a and 2b, the protrusion may include a first protrusion 401 and a second protrusion 402 which are spaced from each other; the doped region may include a first doped region 301 and a second doped region 302 which are respectively disposed on both sides of the channel region 350; the first protrusion 401 is disposed between the gate electrode and the first doped region 301; and the second protrusion 402 is disposed between the gate electrode 500 and the second doped region 302. The first protrusion 401 and the second protrusion 402 can increase a spacing distance between the gate electrode 500 and the two doped regions of the active layer 300, and further reduce the parasitic capacitance in the TFT.

For instance, in at least one embodiment of the present disclosure, as shown in FIGS. 2a and 2b, the gate insulating layer 400 may further include a spacing region 460 disposed between the first protrusion 401 and the second protrusion 402. The spacing region 460 is disposed between the gate electrode 500 and the channel region 350. The spacing region 460 can ensure the electrical performance of the TFT, namely will not increase the spacing distance between the gate electrode 500 and the channel region 350 of the active layer 300. For instance, a portion of the gate electrode 500 overlapped with the first protrusion 401 and the second protrusion 402 is a first portion, and a portion of the gate electrode 500 overlapped with the spacing region 460 is a second portion. Compared with the spacing distance between the second portion and the active layer 300, the spacing distance between the first portion and the active layer 300 is increased. On the premise of not affecting the spacing distance between the gate electrode 500 and the channel region 350, the spacing distance between the first portion of the gate electrode 500 and the doped region in the active layer 300 is increased, for instance, the spacing distance between the first portion of the gate electrode 500 and the first doped region 301 and the second doped region 302 is increased. In this case, the parasitic capacitance produced by overlapping of the gate electrode 500 and the doped region is reduced, so the electrical performance of the TFT can be improved.

For instance, in the TFT provided by the embodiment of the present disclosure, as shown in FIGS. 2a and 2b, the first doped region 301 may include a first heavily doped region 310 and a first lightly doped region 320 contacting each other; the first lightly doped region 320 is disposed between the first heavily doped region 310 and the channel region 350 and is adjacent to the channel region; the second doped region 302 may include a second heavily doped region 340 and a second lightly doped region 330 contacting each other; and the second lightly doped region 330 is disposed between the second heavily doped region 340 and the channel region 350 and is adjacent to the channel region.

For instance, in the TFT provided by the embodiment of the present disclosure, as shown in FIGS. 2a and 2b, the first protrusion 401 further includes a first exposing portion 430; an orthographic projection of the first exposing portion 430 on the base substrate 100 exceeds an orthographic projection of the gate electrode 500 on the base substrate 100; the second protrusion 402 further includes a second exposing portion 440; an orthographic projection of the second exposing portion 440 on the base substrate 100 exceeds the orthographic projection of the gate electrode 500 on the base substrate 100; and the orthographic projections of the first exposing portion 430 and the second exposing portion 440 on the base substrate 100 fall within an orthographic projection of the active layer 300 on the base substrate 100.

The first exposing portion 430 and the second exposing portion 440 may be used for determining positions of the first lightly doped region 320 and the second lightly doped region 330. Moreover, in a direction from a source electrode 710 to a drain electrode 720, lengths of the first lightly doped region 320 and the second lightly doped region 330 may be controlled through the first exposing portion 430 and the second exposing portion 440. In practical processes, other processes (for instance, deposition process, annealing process and the like performed at relatively high temperature) may also be continuously performed after forming the doped region in the active layer 300. In this process, a position of the doped region, for instance, positions of the first lightly doped region 320 and the second lightly doped region 330, may be varied. In the embodiment of the present disclosure, description about the technical solution in which lengths of the first lightly doped region 320 and the second lightly doped region 330 may be controlled by using the first exposing portion 430 and the second exposing portion 440 to realize the self-alignment of the first lightly doped region 320 and the second lightly doped region 330 may refer to relevant content in a fourth embodiment. No further description will be given here.

For instance, in at least one embodiment of the present disclosure, as illustrated in FIGS. 2a and 2b, the TFT may further comprise a source-drain electrode layer 700. The source-drain electrode layer 700 includes a source electrode 710 and a drain electrode 720; the first doped region 301 is electrically connected with the source electrode 710; the second doped region 302 is electrically connected with the drain electrode 720; the first protrusion 401 is disposed between the source electrode 710 and the second portion of the gate electrode 500; and the second protrusion 402 is disposed between the drain electrode 720 and the second portion of the gate electrode 500.

In the embodiment of the present disclosure, positions of the first protrusion 401 and the second protrusion 402 are not limited as long as the parasitic capacitance between the gate electrode 500 and the doped region can be reduced, for instance, the parasitic capacitance between the gate electrode 500 and the heavily doped region (for instance, including the first heavily doped region 310 and the second heavily doped region 340) can be reduced.

For instance, in one example of the embodiment of the present disclosure, a portion of the gate electrode 500 overlapped with the first protrusion 401 and the second protrusion 402 is a first portion. In a direction perpendicular to the base substrate 100, the heavily doped region (for instance, including the first heavily doped region 310 and the second heavily doped region 340) may be partially overlapped with the first portion, but the heavily doped region is not overlapped with the spacing region 460. Thus, the heavily doped region and the gate electrode 500 are completely spaced by the first protrusion 401 and the second protrusion 402, so the parasitic capacitance between the gate electrode 500 and the heavily doped region can be reduced.

For instance, in another example of the embodiment of the present disclosure, the first protrusion 401 may be at least partially overlapped with the first lightly doped region 320; and the second protrusion 402 may be at least partially overlapped with the second lightly doped region 330. In this case, in the direction perpendicular to the base substrate 100, the heavily doped region and the gate electrode 500 is not overlapped with each other, so no parasitic capacitance or small parasitic capacitance will be produced between the heavily doped region and the gate electrode 500. The second portion of the gate electrode 500 overlapped with the spacing region 460 is partially overlapped with the lightly doped region (for instance, including the first lightly doped region 320 and the second lightly doped region 330), but the parasitic capacitance between the second portion and the lightly doped region is small. Therefore, the arrangement of the first protrusion 401 and the second protrusion 402 can reduce the parasitic capacitance between the gate electrode 500 and the doped region.

For instance, in another example of the embodiment of the present disclosure, the first protrusion 401 is at least partially overlapped with the first lightly doped region 320, and the second protrusion 402 is at least partially overlapped with the second lightly doped region 330. In this case, in the direction perpendicular to the base substrate 100, the heavily doped region is not overlapped with the gate electrode 500, so no parasitic capacitance will be produced between the heavily doped region and the gate electrode 500. The lightly doped region and the gate electrode 500 are also completely spaced by the first protrusion 401 and the second protrusion 402, so the parasitic capacitance between the gate electrode 500 and the lightly doped region is reduced.

It should be noted that position relationships among the gate electrode 500, the first protrusion 401, the second protrusion 402 and the doped region may be set according to actual requirements, and no limitation will be given here in the present disclosure, as long as the arrangement of the first protrusion 401 and the second protrusion 402 can reduce the parasitic capacitance between the gate electrode 500 and the doped region.

For instance, in the TFT provided by some examples of the embodiment of the present disclosure, the gate insulating layer 400 may further include a planarization portion 450 disposed outside the first protrusion 401 and the second protrusion 402 relative to the gate electrode 500. In the direction perpendicular to the base substrate 100, the first heavily doped region 310 and the second heavily doped region 340 are respectively at least partially overlapped with the planarization portion 450. The source electrode 710 and the drain electrode 720 in the source-drain electrode layer 700 are electrically connected with the active layer 300 via through holes formed in the planarization portion 450. The first heavily doped region 310 and the second heavily doped region 340 are respectively at least partially overlapped with the planarization portion 450. For instance, the first heavily doped region 310 may be electrically connected with the source electrode 710, and the second heavily doped region 340 may be electrically connected with the drain electrode 720. Thus, the electrical performance between the active layer 300 and the source-drain electrode layer 700 can be improved.

In the TFT provided by some embodiments of the present disclosure, the gate insulating layer 400 may be a single-layer structure and may also be a two-layer structure or a structure of more than two layers, as long as the insulating layer 400 at least includes the first protrusion 401 and the second protrusion 402 satisfying the requirement in the above embodiment.

For instance, in one example of the embodiment of the present disclosure, the gate insulating layer 400 is a one-layer (single-layer) structure. Moreover, a portion of the gate insulating layer 400 away from the active layer 300 is configured as the first protrusion 401 and the second protrusion 402.

For instance, in the embodiment, the process of forming the first protrusion 401 and the second protrusion 402 by the portion of the gate insulating layer 400 with the one-layer structure away from the active layer 300 may include: patterning a gate insulating layer film by using a dual-tone mask (for instance, a half-tone mask or a gray-tone mask), and meanwhile, forming the gate insulating layer 400 provided with the first protrusion 401 and the second protrusion 402.

For instance, the patterning process may be executed as below. Firstly, the gate insulating layer film is formed; a photoresist layer is coated on the gate insulating layer film; the photoresist layer is exposed by using the dual-tone mask; and a photoresist pattern is obtained by developing the exposed photoresist layer. The photoresist pattern include a photoresist-completely-retained portion, a photoresist-partially-retained portion and photoresist-completely-removed portion. The photoresist-completely-retained portion corresponds to a region in which the first protrusion 401 and the second protrusion 402 are to be formed; the photoresist-partially-retained portion corresponds to the spacing region between the first protrusion 401 and the second protrusion 402 (and the planarization portion outside the first protrusion 401 and the second protrusion 402 under a condition that the planarization portion is provided); and the photoresist-completely-removed portion corresponds to other regions. Then, the gate insulating layer film is etched by adoption of the photoresist pattern as an etching mask. Thirdly, the photoresist pattern is subjected to an ashing process, so as to reduce a thickness of the photoresist-completely-retained portion and remove the photoresist-partially-retained portion. Fourthly, the exposed gate insulating layer film is partially etched (only removing a portion of the gate insulating layer film) by using a remaining photoresist pattern. Then, the remaining photoresist pattern is removed. Finally, the gate insulating layer provided with the first protrusion 401, the second protrusion 402 and the spacing region (and the planarization portion, if provided) is obtained.

For instance, in another example of the embodiment of the present disclosure, the gate insulating layer 400 at least includes a first gate insulating layer 410 and a second gate insulating layer 420 which are superimposed to each other; the second gate insulating layer 420 is disposed on one side of the first gate insulating layer 410 away from the active layer 300; and a portion of the second gate insulating layer 420 away from the active layer 300 is configured as the first protrusion 401 and the second protrusion 402.

Figure 2C:
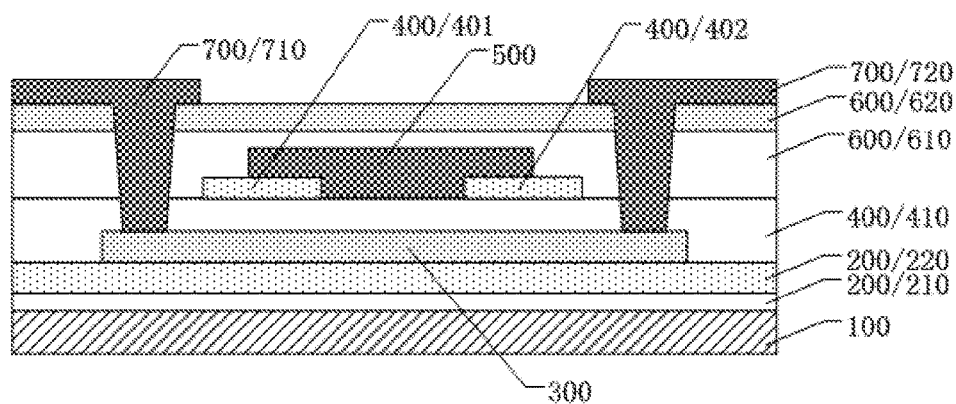
FIG. 2c is a cross-sectional view of a TFT provided by another embodiment of the present disclosure.

For instance, in another example of the embodiment of the present disclosure, FIG. 2c is a cross-sectional view of a TFT provided by another embodiment. For instance, as shown in FIG. 2c, the gate insulating layer 400 at least includes a first gate insulating layer 410 and a second gate insulating layer 420; and the second gate insulating layer 420 is disposed on one side of the first gate insulating layer 410 away from the active layer 300, and configured to be formed as the protrusion.

In at least one embodiment of the present disclosure, a hydrogen content in the gate insulating layer 400 may be as low as possible, so as to improve the electrical performance of the active layer. For instance, in the TFT provided by the embodiment of the present disclosure, materials of the gate insulating layer 400 may include silicon nitride (SiNx), silicon oxide (SiOx), aluminum oxide ($Al_2O_3$), aluminum nitride (AlN) or other suitable materials. Under a condition that the gate insulating layer 400 at least includes the first gate insulating layer 410 and the second gate insulating layer 420, the hydrogen content of the first gate insulating layer may be lower than that of the second gate insulating layer 420. For instance, the first gate insulating layer 410 may be SiOx, for instance, may be formed by a reaction between nitrous oxide and ethyl orthosilicate; and the second gate insulating layer 420 may be SiNx. For instance, a thickness of the first gate insulating layer 410 may be ranged from 50 nm to 100 nm; and a thickness of the second gate insulating layer may be ranged from 40 nm to 80 nm.

For instance, in at least one embodiment of the present disclosure, the TFT may be a top-gate TFT. For instance, the gate electrode 500 may be disposed on a side of the active layer 300 away from the base substrate 100. The TFT may also be a dual-gate TFT. For instance, the gate electrode may be disposed on a side of the active layer 300 away from the base substrate 100 and a side of the active layer 300 close to the base substrate 100. The first protrusion 401 and the second protrusion 402 disposed in the TFT can reduce the parasitic capacitance between the gate electrode 500 and the active layer 300, or the self-alignment of the lightly doped region can be realized through the first protrusion 401 and the second protrusion 402. For convenient understanding of the technical proposals of the present disclosure, description will be given in the following embodiments of the present disclosure by taking the case that the TFT is a top-gate TFT as an example, but the embodiment of the present disclosure is obviously not limited to the example.

For instance, in the embodiment of the present disclosure, the TFT may further comprise an interlayer medium layer 600. The interlayer medium layer 600 is disposed between the source-drain electrode layer 700 and the gate electrode 500. For instance, the interlayer medium layer 600 may be a single-layer structure and may also be a two-layer structure or a structure of more than two layers. Materials of the interlayer medium layer 600 may include inorganic insulating materials such as SiNx and SiOx and may also be organic insulating materials. For instance, the interlayer medium layer 600 may include a first interlayer medium layer 610 and a second interlayer medium layer 620. For instance, one of the first interlayer medium layer 610 and the second interlayer medium layer 620 (for instance, the first interlayer medium layer 610) is an inorganic insulating layer and the other (for instance, the second interlayer medium layer 620) is an organic insulating layer.

For instance, in at least one embodiment of the present disclosure, the TFT may further comprise a buffer layer 200 disposed between the base substrate 100 and the active layer 300. The buffer layer 200 may be a single-layer structure and may also be a two-layer structure or a structure of more than two layers. Materials of the buffer layer may include SiNx, SiOx, etc. For instance, the buffer layer may include a first buffer layer 210 and a second buffer layer 220; the first buffer layer 210 is disposed between the second buffer layer 220 and the base substrate 100; and a hydrogen content in the second buffer layer 220 is lower than the hydrogen content in the first buffer layer, so as to avoid to effect the electrical performance of the active layer 300. For instance, the material of the first buffer layer 210 may be SiNx, and a thickness of the first buffer layer may be ranged from 100 nm to 300 nm; and the material of the second buffer layer 220 may be SiOx, and a thickness of the second buffer layer may be ranged from 50 nm to 100 nm.

It should be noted that the structure improvements applicable to the conventional TFT may also be applicable to the TFT provided by the embodiment of the present disclosure. For instance, as for a top-gate TFT, a light shielding layer corresponding to the active layer 300 may also be disposed between the active layer 300 and the base substrate 100. In the embodiment of the present disclosure, other structure improvements on the TFT are not limited in the present disclosure.

A Second Embodiment

At least one embodiment of the present disclosure provides an array substrate, which comprises the TFT provided by the above embodiments. The array substrate comprises a plurality of gate lines and a plurality of data lines. The plurality of gate lines and the plurality of data lines are intersected with each other to define a plurality of subpixels. Each subpixel includes a pixel electrode and the TFT taken as a switching element.

Figure 3:
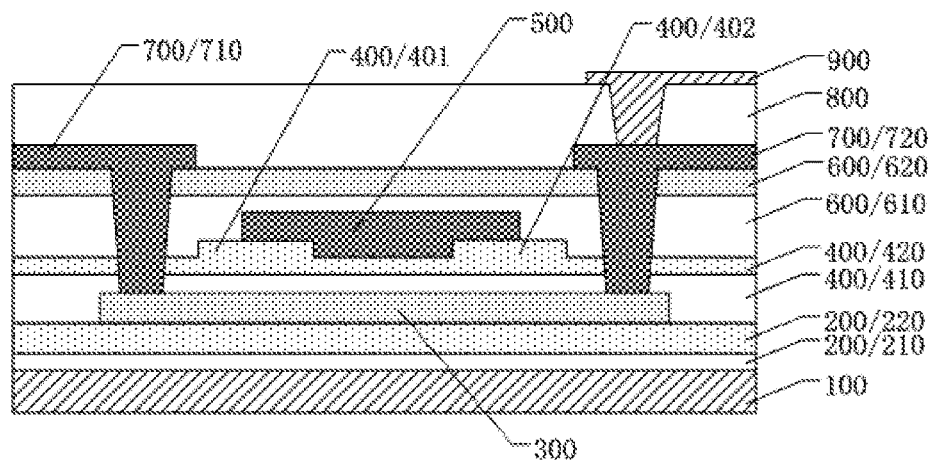
FIG. 3 is a partial cross-sectional view of an array substrate provided by an embodiment of the present disclosure.

FIG. 3 is a partial cross-sectional view of an array substrate provided by an embodiment of the present disclosure, and is a cross-sectional view of a region in which the TFT is disposed. For instance, as shown in FIG. 3, in an embodiment of the present disclosure, the array substrate may comprise the TFT provided by the first embodiment and may further comprise a planarization layer 800 and a first electrode layer 900. The planarization layer 800 may be provided with a through hole. The first electrode layer 900 may be electrically connected with the source-drain electrode layer 700 of the TFT by using the through hole. For instance, the first electrode layer 900 is electrically connected with the drain electrode 720 of the source-drain electrode layer 700.

For instance, the array substrate may be applicable to, for instance, a liquid crystal display (LCD) panel, an organic light-emitting diode (OLED) display panel, an e-paper display panel, etc. The layer structures of the TFT may refer to relevant content in the first embodiment. No further description will be given here. More specifically, for instance, as for the array substrate applicable to the LCD panel, the gate electrode of the TFT of the subpixel is electrically connected with the gate line corresponding to the subpixel; the source electrode of the TFT is electrically connected with the data line corresponding to the subpixel; and the drain electrode is electrically connected with the pixel electrode of the subpixel. For instance, as for the array substrate applicable to the OLED display panel, the gate electrode of the TFT of the subpixel is electrically connected with a storage capacitor; the source electrode of the TFT is electrically connected with a power line corresponding to the subpixel; and the drain electrode is electrically connected with the pixel electrode of the subpixel.

For instance, in the embodiment of the present disclosure, the planarization layer 800 may be made from an inorganic insulating material such as SiNx and SiOx or an organic insulating material such as acrylic resin, and may also be made from other acrylic materials.

For instance, in one example of the embodiment of the present disclosure, the first electrode layer 900 is a pixel electrode. The materials of the pixel electrode 900 may include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotubes, etc.

For instance, in one example of the embodiment of the present disclosure, the first electrode layer 900 may be an anode or a cathode of an OLED. Taking the case that the first electrode layer 900 is the anode of the OLED as an example, the array substrate may further comprise an organic function layer and the cathode disposed above the anode 900 of the OLED. For instance, the organic material function layer may include: a hole transport layer (HTL), an emission layer (EML) and an electron transport layer (ETL). In order to improve the injection efficiency of electrons and holes into the EML, the organic material function layer may further include an electron injection layer (EIL) disposed between the cathode and the ETL and a hole injection layer (HIL) disposed between the anode 900 and the HTL.

According to difference materials of the anode 900 and the cathode, the OLED may be divided into single-sided emission type and double-sided emission type. That is to say, when the material of one of the anode 900 and the cathode is opaque or semitransparent material, the OLED is single-sided emission type; and when the materials of both the anode 900 and the cathode are transparent and/or semitransparent materials, the OLED is double-sided emission type.

For the single-sided emission type OLED, according to different materials of the anode 900 and the cathode, the single-sided emission type OLED may also be divided into top-emission type and bottom-emission type. Under a condition that the anode 900 is arranged close to the base substrate 100 and the cathode is arranged away from the base substrate 100, if a material of the anode 900 is a transparent conductive material and a material of the cathode is an opaque conductive material, as light is emitted through the anode 900 and then is emitted from a side of the base substrate 100, the OLED may be called as the bottom-emission type; if the material of the anode 900 is the opaque conductive materials and the material of the cathode is the transparent or semitransparent conductive material, as light is emitted from a side of the cathode away from the base substrate 100, the OLED may be called as the top-emission type. The above two relative positions of the anode 900 and the cathode may also be replaced. No further description will be given here.

As for a double-sided emission type flexible display substrate, when the anode 900 is arranged close to the base substrate 100 and the cathode is arranged away from the base substrate 100, if materials of both the anode 900 and the cathode are transparent conductive and/or semitransparent materials, as light is emitted from the anode 900 and then emitted from a side of the base substrate 100 on one hand and emitted from a side of the cathode away from the base substrate 100 on the other hand, the display substrate may be referred to as the double-sided emission type. Herein, the anode 900 may also be arranged away from the base substrate 100 and the cathode may also be arranged close to the base substrate 100.

It should be noted that the structure of the array substrate provided by the embodiment of the present disclosure is not limited to the above content. For instance, the array substrate as shown in FIG. 3 may also comprise structures such as a pixel define layer and/or a spacer. When the array substrate is applied to a display panel, the spacer may be configured to support the space between the array substrate and an opposed substrate. In the embodiment of the present disclosure, other structure improvements on the array substrate are not limited in the present disclosure, as long as the array substrate comprises the TFT provided by the embodiment of the present disclosure.

A Third Embodiment

At least one embodiment of the present disclosure provides a display device, which comprises the array substrate provided by any foregoing embodiment. The display device may be: any product or component with display function such as an LCD panel, e-paper, an OLED panel, a mobile phone, a tablet PC, a TV, a display, a notebook computer, a digital picture frame and a navigator.

One example of the display device is an LCD device. An LCD panel of the LCD device may include an array substrate and an opposed substrate which are arranged oppositely to form a liquid crystal cell, and a liquid crystal material is filled in the liquid crystal cell. The opposed substrate is, for instance, a color filter (CF) substrate. A pixel electrode of each pixel unit in the array substrate is configured to apply an electric field to control the rotation degree of the liquid crystal material and then achieve display.

Another example of the display device is an OLED display device, wherein an array substrate in a display panel of the display device may be provided with a superimposed layer made from organic light-emitting functional materials, and an anode or a cathode of each pixel unit is configured to drive the organic light-emitting material to emit light and then achieve display.

Still another example of the display device is an e-paper display device, wherein an array substrate of the display device is provided with an electronic ink layer, and a pixel electrode of each pixel unit is configured to apply voltage for driving charged microparticles in electronic ink to move so as to achieve display.

A Fourth Embodiment

At least one embodiment of the present disclosure provides a method for manufacturing a TFT. The manufacturing method provided by the embodiment may comprise: providing a base substrate; forming an active layer, a gate insulating layer and a gate electrode on the base substrate in sequence; and forming a channel region and a doped region disposed on at least one side of the channel region in the active layer, wherein the gate insulating layer is provided with a protrusion disposed between the doped region and the gate electrode.

It should be noted that the specific structure of the TFT manufactured by the manufacturing method provided by the embodiment of the present disclosure may refer to relevant content of the TFT provided by the first embodiment. No further description will be given here.

Figure 4A:
FIGS. 4a-4i are flow diagrams of a method for manufacturing a TFT, provided by an embodiment of the present disclosure.

For convenient understanding of the method for manufacturing the TFT, provided by the embodiment of the present disclosure, description is given to the processes of the manufacturing method in at least one example of the embodiment of the present disclosure. FIGS. 4a-4i are flow diagrams of the method for manufacturing the TFT, provided by an embodiment of the present disclosure. Taking a structure of the TFT as shown in FIG. 2a as an example, for instance, as shown in FIGS. 4a-4i, the method for manufacturing the TFT, provided by one example of the present disclosure, may comprise the following processes:

As shown in FIG. 4a, providing a base substrate 100, and forming a buffer layer 200 on the base substrate 100. A material of the base substrate 100 may be a transparent material, for instance, may be glass, transparent resin, etc.

The buffer layer 200 may be a single-layer structure and may also be a multilayer structure of two or more than two layers. The specific structure, the material and the like of the buffer layer may refer to relevant content in the first embodiment. No further description will be given here.

Figure 4B:
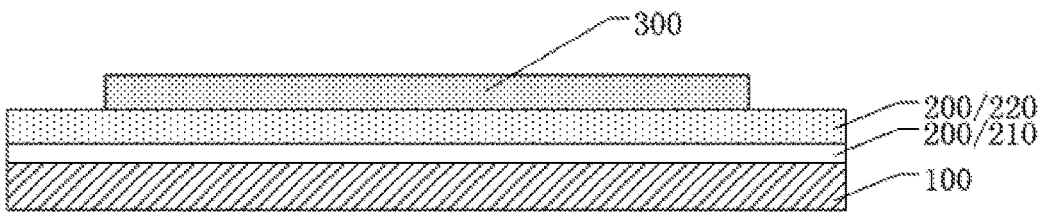

As shown in FIG. 4b, a semiconductor film is formed on the buffer layer 200 and patterned to form an active layer 300.

Materials of the active layer 300 may include a poly-Si, an oxide semiconductor and the like, and a thickness of the active layer may be ranged from 40 nm to 50 nm. Taking the case that the active layer 300 is made from the poly-Si as an example, a process of forming the active layer 300 may include: forming an amorphous silicon film on the buffer layer 200; performing an annealing process on the amorphous silicon film to reduce a hydrogen content in the amorphous silicon film, for instance, the hydrogen content may be controlled to be the atomic percentage of 2% or less; performing, for instance, an excimer laser annealing process on the amorphous silicon film to convert the amorphous silicon film into a poly-Si film; and forming the active layer 300 by patterning the poly-Si film.

In the embodiment, the patterning process, for instance, may include: coating a photoresist layer on a structural layer required to be patterned; performing exposure on the photoresist layer via a mask; developing the photoresist layer after exposure to obtain a photoresist pattern; etching the structural layer by adoption of the photoresist pattern as a mask; and optionally removing the photoresist pattern.

Figure 4C:
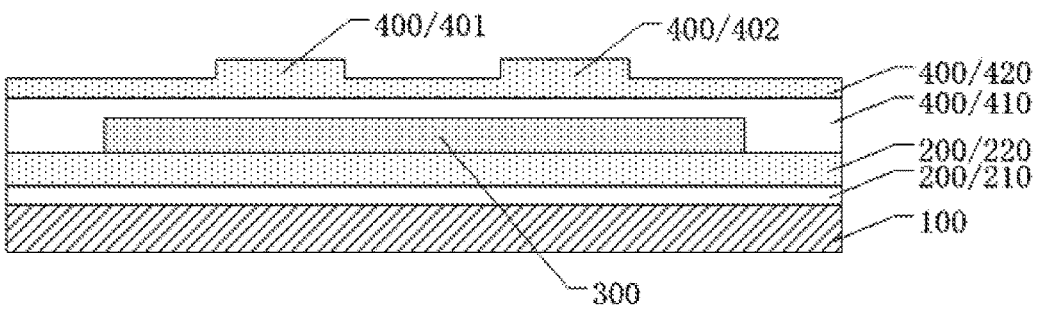

As shown in FIG. 4c, a gate insulating layer film is deposited on the base substrate 100 and patterned to form a gate insulating layer 400. A first protrusion 401 and a second protrusion 402 are at least formed on a side of the gate insulating layer 400 away from the active layer 300. The specific structure of the active layer 300 and the setting means of the first protrusion 401 and the second protrusion 402 may refer to relevant content in the first embodiment. No further description will be given here.

Figure 4D:
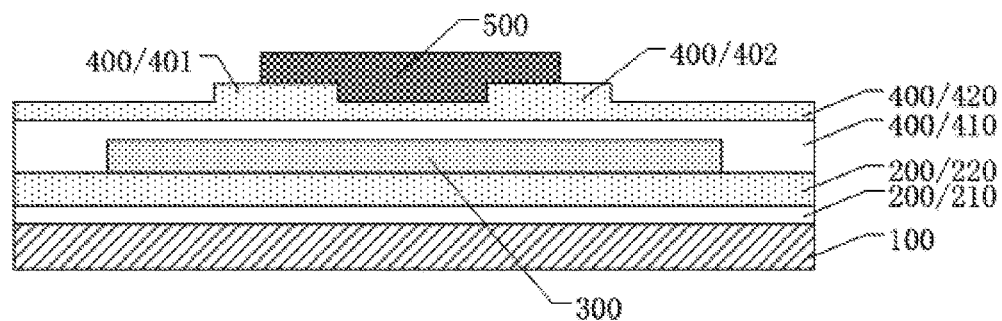

As shown in FIG. 4d, a gate electrode film is deposited on the base substrate 100 and patterned to form a gate electrode 500. A structure of the gate electrode 500 and position relationships between the gate electrode and the first protrusion 401 and the second protrusion 402 may refer to relevant description in the first embodiment. No further description will be given here.

For instance, materials of the gate electrode 500 may be copper-base metal such as copper (Cu), copper-molybdenum alloy (Cu/Mo), copper-titanium alloy (Cu/Ti), copper-molybdenum-titanium alloy (Cu/Mo/Ti), copper-molybdenum-tungsten alloy (Cu/Mo/W) and copper-molybdenum-niobium alloy (Cu/Mo/Nb); materials of the gate electrode 500 may also be chromium-base metal such as chromium-molybdenum alloy (Cr/Mo), chromium-titanium alloy (Cr/Ti) and chromium-molybdenum-titanium alloy (Cr/Mo/Ti); and the materials of the gate electrode 500 may also be aluminum (Al), Al alloy, etc.

Figures 1, 4E:
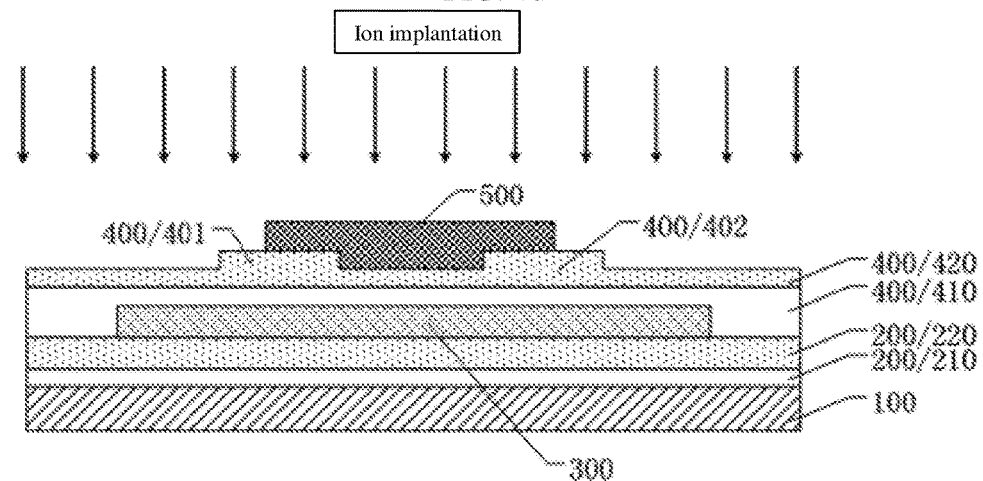
Figures 2, 4E:
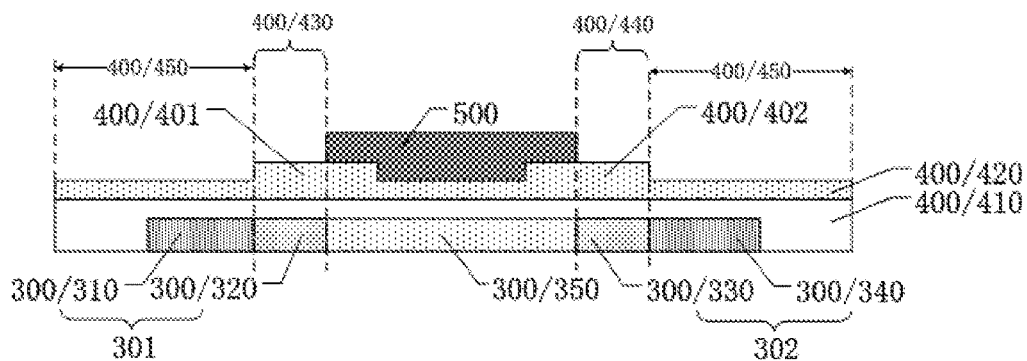

As shown in FIGS. 4e-1 and 4e-2, a heavily doped region, a lightly doped region and a channel region are formed in the active layer 300 by performing a doping process on the active layer 300 through the gate insulating layer 400. The doping process may be an ion implantation. FIG. 4e-1 is a flow diagram illustrating the ion implantation process on the active layer 300, and FIG. 4e-2 is a partial cross-sectional view of an array substrate obtained after ion implantation process.

As shown in FIGS. 4e-1 and 4e-2, a first heavily doped region 310, a first lightly doped region 320, a channel region 350, a second lightly doped region 330 and a second heavily doped region 340 may be formed in the active layer 300 by the ion implantation. In a direction perpendicular to the base substrate 100, the doped region and the channel region 350 are formed by adoption of the gate electrode 500 as a mask, and a projection of the channel region 350 on the base substrate 100 is coincident with a projection of a second portion of the gate electrode 500 on the base substrate 100, namely widths of both are equal to each other.

As the gate insulating layer 400 is provided with the first protrusion 401 and the second protrusion 402, a thickness of the gate insulating layer 400 at the first protrusion 401 and the second protrusion 402 is greater than a thickness of the gate insulating layer 400 at a planarization portion 450, at a region in which the gate insulating layer 400 covers the active layer 300, so that an ion implantation concentration of the first lightly doped region 320 is less than that of the first heavily doped region 310, and an ion implantation concentration of the second lightly doped region 330 is less than that of the second heavily doped region 340. In the ion implantation process, the heavily doped region may be formed in the active layer 300 through a portion of the gate insulating layer 400 with relatively small thickness, and the lightly doped region may be formed in the active layer 300 through a portion of the gate insulating layer 400 with relatively large thickness. Therefore, the first lightly doped region 320 may be formed at a position of the active layer 300 corresponding to a first exposing portion 430 through the first exposing portion 430 of the first protrusion 401; and the second lightly doped region 330 may be formed at a position of the active layer 300 corresponding to a second exposing portion 440 through the second exposing portion 440 of the second protrusion 402. That is to say, orthographic projections of the first exposing portion 430 and the first lightly doped region 320 on the base substrate 100 are coincident; orthographic projections of the second exposing portion 440 and the second lightly doped region 330 on the base substrate 100 are coincident; widths of the first exposing portion 430 and the first lightly doped region 320 are equal to each other; and widths of the second exposing portion 440 and the second lightly doped region 330 are equal to each other. Thus, self-alignment can be realized in a forming process of the lightly doped region (which may include the first lightly doped region 320 and the second lightly doped region 330) in the active layer 300. Compared with the method for manufacturing the TFT as shown in FIGS. 1c-1f, steps such as patterning process of the gate electrode 500 are not required. Thus, the processes are simplified; the problems such as low alignment accuracy between the gate electrode 500 and the lightly doped region due to the factors such as limited equipment accuracy and process change are reduced; and the cost is reduced.

Figures 1, 4F:
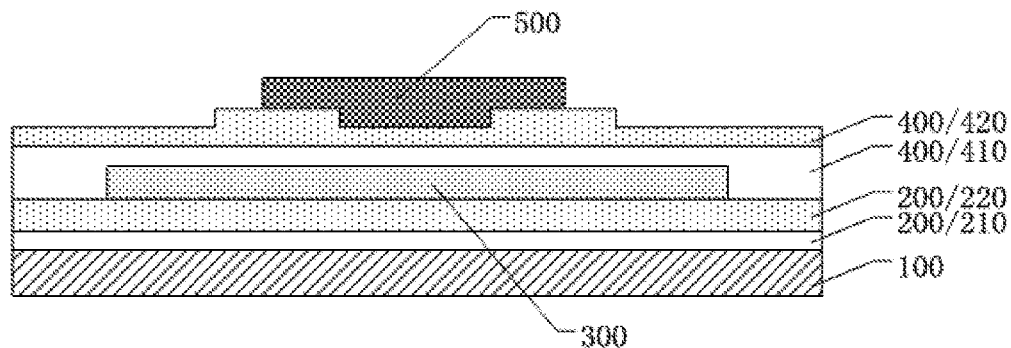
Figures 2, 4F:
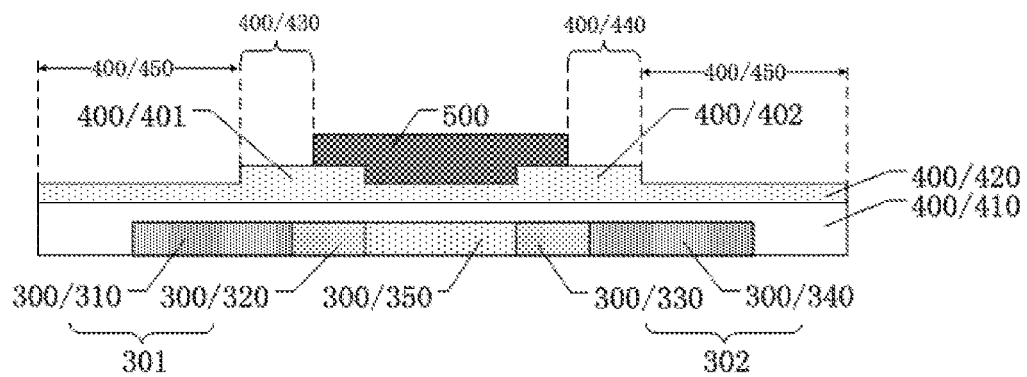

As shown in FIGS. 4f-1 and 4f-2, the active layer 300 is subjected to annealing process after forming the first heavily doped region 310, the first lightly doped region 320, the channel region 350, the second lightly doped region 330 and the second heavily doped region 340 in the active layer 300. FIG. 4f-1 is a flow diagram illustrating the annealing process on the active layer 300, and FIG. 4f-2 is a partial cross-sectional view of an array substrate obtained after the annealing process on the active layer 300.

As shown in FIGS. 4f-1 and 4f-2, after the annealing process of the active layer 300, the doped region in the active layer 300 will be extended, namely the first heavily doped region 310 and the first lightly doped region 320 will move towards positions of the second lightly doped region 330 and the second heavily doped region 340, and the second lightly doped region 330 and the second heavily doped region 340 will move towards positions of the first heavily doped region 310 and the first lightly doped region 320.

Figure 4G:
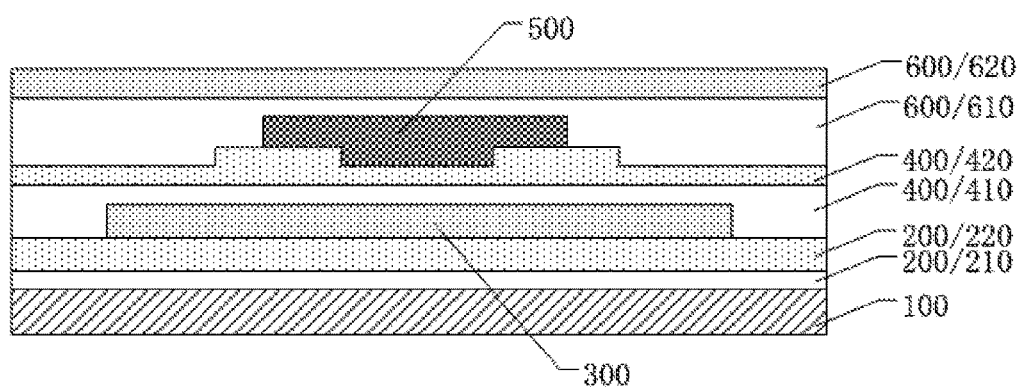

As shown in FIG. 4g, an interlayer medium layer 600 is formed on the base substrate 100. The interlayer medium layer 600 may be a single-layer structure and may also be a multi-layer structure of two layers or more than two layers. The specific structure, the materials and the like of the interlayer medium layer may refer to relevant content in the first embodiment. No further description will be given here.

Figure 4H:
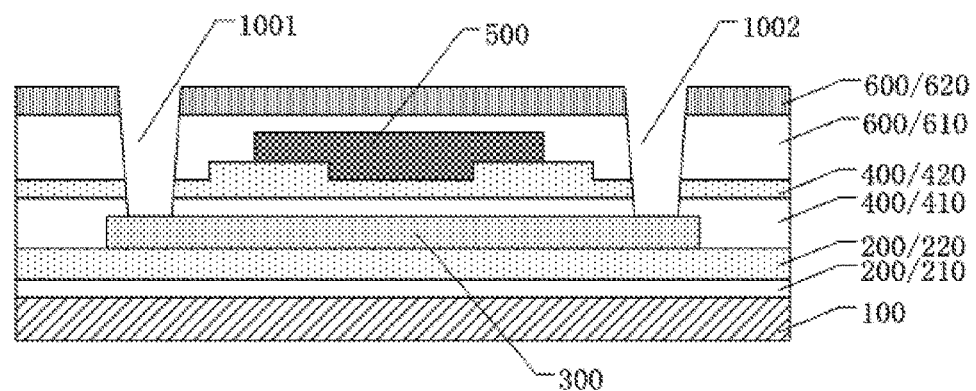

As shown in FIG. 4h, a first through hole 1001 and a second through hole 1002 penetrating the interlayer medium layer 600 and the gate insulating layer 400 are formed. The first through hole 1001 and the second through hole 1002 may respectively expose the first heavily doped region 310 and the second heavily doped region 340 of the active layer 300.

For instance, in the embodiment of the present disclosure, the interlayer medium layer 600 may be made from a composite material of silicon oxide and silicon nitride. After forming the first through hole 1001 and the second through hole 1002, the interlayer medium layer 600 and the gate insulating layer 400 may be subjected to high-temperature annealing process, so that hydrogen therein is diffused. Thus, hydrogen dangling bonds in the above structure damaged due to forming the first through hole 1001 and the second through hole 1002 can be repaired, and hence the electrical performance of the TFT can be improved.

Figure 4I:
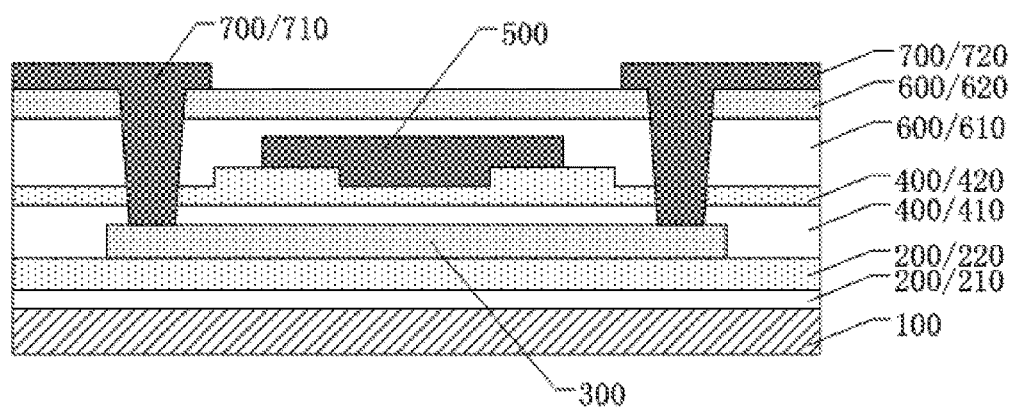

As shown in FIG. 4i, a conductive layer film is deposited on the base substrate 100 and patterned to form a source-drain electrode layer 700. The source-drain electrode layer 700 may include a source electrode 710 and a drain electrode 720. For instance, the source electrode 710 may be electrically connected with the first heavily doped region 310 of the active layer 300 via the first through hole 1001; and the drain electrode 720 may be electrically connected with the second heavily doped region 340 of the active layer 300 via the second through hole 1002.

For instance, materials of the source-drain electrode layer 700 may include a metallic material such as Mo, Ti, Cu and Cr or an alloy material formed by the above metals. For instance, Cu-base alloy materials include CuMo, CuTi, CuMoTi, CuMoW, CuMoNb or the like; and Cr-base alloy materials include CrMo, CrTi, CrMoTi, etc.

A Fifth Embodiment

At least one embodiment of the present disclosure provides a method for manufacturing an array substrate, wherein the array substrate includes the TFT provided by the above embodiment, and the TFT is manufactured by the manufacturing method provided by the fourth embodiment.

For convenient understanding of the method for manufacturing the array substrate, provided by the embodiment of the present disclosure, description is given to the processes of the manufacturing method in at least one example of the embodiment of the present disclosure. FIGS. 5a-5d are flow diagrams of the method for manufacturing the array substrate, provided by an embodiment of the present disclosure.

Figure 5A:
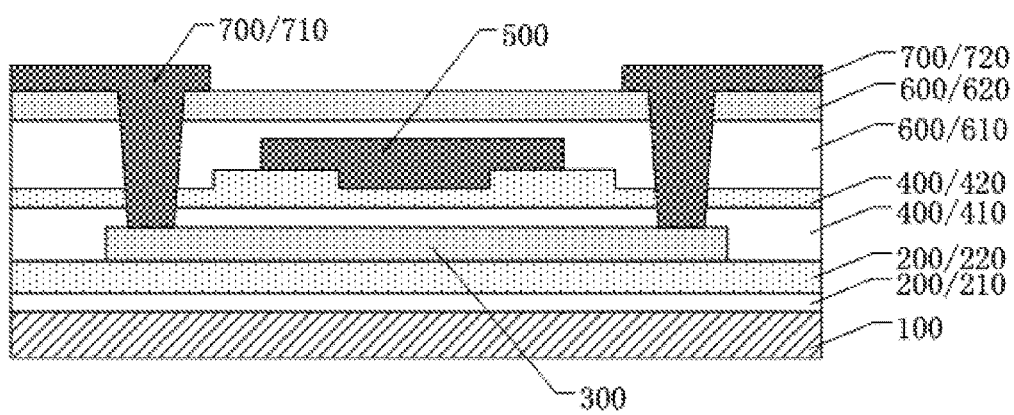
FIGS. 5a-5d are flow diagrams of a method for manufacturing an array substrate provided by an embodiment of the present disclosure.

Taking a structure of the array substrate as shown in FIG. 3 as an example, for instance, as shown in FIGS. 5a-5d, the method for manufacturing the array substrate, provided by an example of the present disclosure, may comprise the following steps:

As shown in FIG. 5a, an array substrate provided with a TFT is provided. The manufacturing process of the TFT on the array substrate may refer to relevant description in the fourth embodiment. No further description will be given here.

Figure 5B:
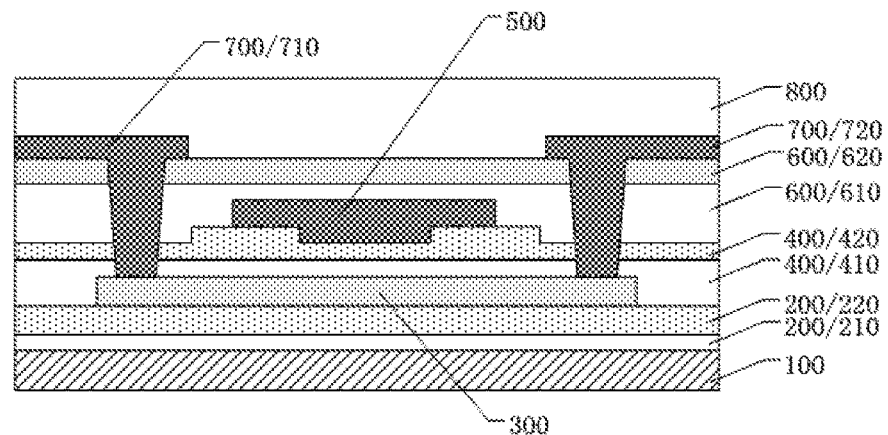

As shown in FIG. 5b, a planarization layer 800 is formed on the base substrate 100. A method for forming the planarization layer 800 may be spin-coating method, etc. For instance, the planarization layer 800 may be made from SiNx, SiOx, acrylic resin or the like and may also be made from other acrylic materials.

Figure 5C:
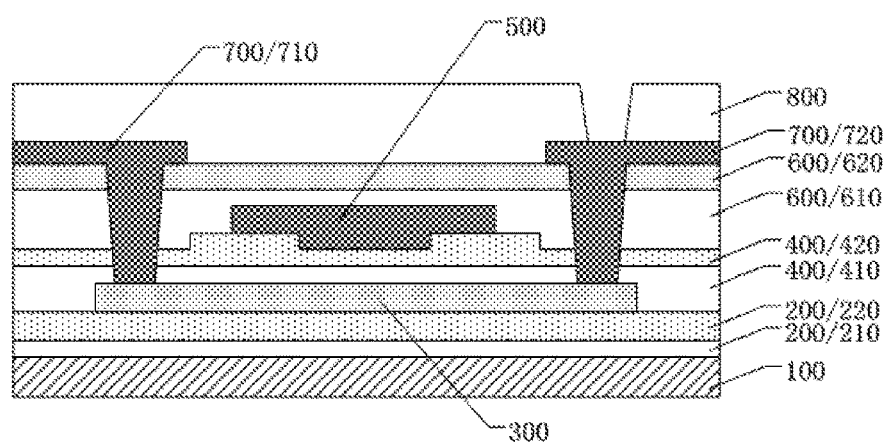

As shown in FIG. 5c, a third through hole 1003 is formed in the planarization layer 800. The third through hole 1003 may expose a portion of the source-drain electrode layer 700. For instance, the third through hole 1003 may expose a portion of the drain electrode 720 in the source-drain electrode layer 700.

Figure 5D:
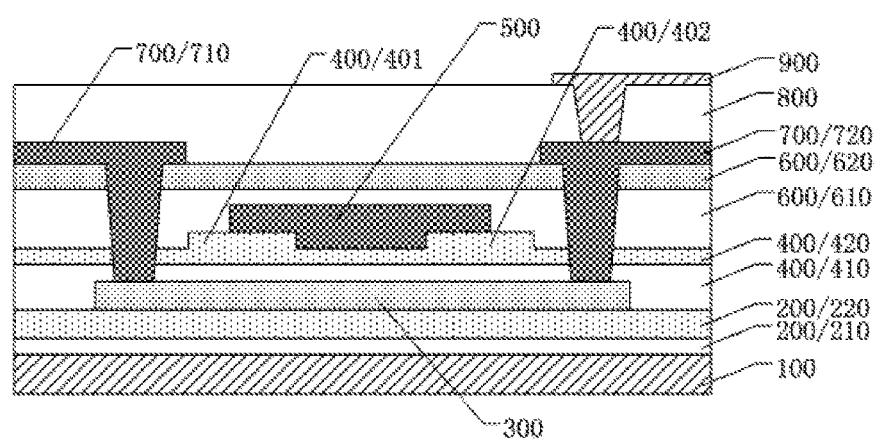

As shown in FIG. 5d, a conductive layer film is deposited on the base substrate 100 and patterned to form a first electrode layer 900. A structure, a material and the like of the first electrode layer 900 may refer to relevant content in the second embodiment. No further description will be given here.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness a layer or area may be enlarged or narrowed, that is, the drawings are not drawn in a real scale.

(3) In case of no conflict, features in one embodiment or in different embodiments can be combined.

The above mentioned is the specific embodiments of the present disclosure, but the protection range of the present disclosure is not limited to this, the protection range of the present disclosure should be defined by the protection range of the claims.

The application claims priority to the Chinese patent application No. 201710236997.4, filed Apr. 12, 2017, the disclosure of which is incorporated herein by reference as part of the application.

The invention claimed is:

1. A thin-film transistor (TFT), comprising:
a base substrate;
a gate electrode and a gate insulating layer, disposed on the base substrate; and
an active layer, wherein the gate insulating layer is disposed between the active layer and the gate electrode;
the active layer includes a channel region and a doped region disposed on at least one side of the channel region; and
the gate insulating layer is provided with a protrusion which is disposed between the doped region and the gate electrode,
wherein, the protrusion includes a first protrusion and a second protrusion which are spaced from each other, the doped region includes a first doped region and a second doped region which are respectively disposed on both sides of the channel region,
the first doped region comprises a first lightly doped region and a first heavily doped region, the second doped region comprises a second lightly doped region and a second heavily doped region, and a carrier concentration of the first lightly doped region and the second lightly doped region is smaller than a carrier concentration of the first heavily doped region and the second heavily doped region,
the first protrusion further includes a first exposing portion, an orthographic projection of the first exposing portion on the base substrate exceeds an orthographic projection of the gate electrode on the base substrate;
the second protrusion further includes a second exposing portion, an orthographic projection of the second exposing portion on the base substrate exceeds the orthographic projection of the gate electrode on the base substrate, and the first exposing portion at least partially overlaps with the first lightly doped region, the second exposing portion at least partially overlaps with the second lightly doped region,
the gate insulating layer further includes a spacing region disposed between the first protrusion and the second protrusion, and the spacing region is disposed between the gate electrode and the channel region, the spacing region completely overlaps with the channel region, and
the gate insulating layer includes a planarization portion disposed outside the first protrusion and the second protrusion and overlapped with the first heavily doped region and the second heavily doped region,
a thickness of the protrusion is larger than a thickness of the spacing region and a thickness of the planarization portion.

2. The TFT according to claim 1, wherein
the first protrusion is disposed between the gate electrode and the first doped region, and the second protrusion is disposed between the gate electrode and the second doped region.

3. The TFT according to claim 1, wherein
the orthographic projections of the first exposing portion and the second exposing portion fall within an orthographic projection of the active layer on the base substrate.

4. The TFT according to claim 1, wherein
the gate electrode is disposed on a side of the active layer away from the base substrate.

5. The TFT according to claim 4, wherein
the gate insulating layer at least includes a first gate insulating layer and a second gate insulating layer; and
the second gate insulating layer is disposed on a side of the first gate insulating layer away from the active layer and configured as the protrusion.

6. The TFT according to claim 5, wherein
a hydrogen content of the first gate insulating layer is lower than that of the second gate insulating layer.

7. An array substrate, comprising the TFT according to claim 1.

8. A display device, comprising the array substrate according to claim 7.

* * * * *